(12) United States Patent
Hirama

(10) Patent No.: US 8,040,315 B2
(45) Date of Patent: Oct. 18, 2011

(54) DEVICE FOR DRIVING A DISPLAY PANEL WITH SEQUENTIALLY DELAYED DRIVE SIGNAL

(75) Inventor: Atsushi Hirama, Tokyo (JP)

(73) Assignee: Oki Semiconductor Co., Ltd. (JP)

( * ) Notice: Subject to any disclaimer, the term of this patent is extended or adjusted under 35 U.S.C. 154(b) by 1010 days.

(21) Appl. No.: 11/637,916

(22) Filed: Dec. 13, 2006

(65) Prior Publication Data

US 2007/0146290 A1    Jun. 28, 2007

(30) Foreign Application Priority Data

Dec. 28, 2005    (JP) .................................. 2005-378254

(51) Int. Cl.
    *G09G 3/36*    (2006.01)
(52) U.S. Cl. ...................................................... 345/100
(58) Field of Classification Search ............ 345/98–100, 345/204; 377/64–81
    See application file for complete search history.

(56) References Cited

U.S. PATENT DOCUMENTS

| | | | | |
|---|---|---|---|---|
| 5,003,228 A * | 3/1991 | Hada et al. ................... | 315/169.4 |
| 5,223,824 A * | 6/1993 | Takeda et al. .................... | 345/93 |
| 5,990,857 A * | 11/1999 | Kubota et al. .................... | 345/98 |
| 6,049,318 A * | 4/2000 | Ota ................................. | 345/93 |
| 6,414,670 B1 * | 7/2002 | Kim ................................. | 345/98 |
| 6,445,372 B1 * | 9/2002 | Asai ................................. | 345/99 |
| 6,583,775 B1 * | 6/2003 | Sekiya et al. ....................... | 345/76 |
| 6,614,418 B2 * | 9/2003 | Koyama et al. .................. | 345/103 |
| 6,693,617 B2 * | 2/2004 | Sasaki et al. ...................... | 345/98 |
| 6,831,625 B2 * | 12/2004 | Matsushima et al. ........... | 345/98 |
| 7,151,538 B2 * | 12/2006 | Yamashita et al. ............. | 345/213 |
| 7,154,488 B2 | 12/2006 | Morita | |
| 7,193,604 B2 * | 3/2007 | Kubota et al. ................... | 345/100 |
| 7,289,593 B2 * | 10/2007 | Tobita et al. ...................... | 377/64 |
| 7,342,576 B2 * | 3/2008 | Chegal ........................... | 345/204 |
| 7,420,534 B2 * | 9/2008 | Yamashita et al. ............. | 345/100 |
| 7,605,793 B2 * | 10/2009 | Lee ................................... | 345/100 |
| 2005/0008114 A1 * | 1/2005 | Moon ............................... | 377/64 |
| 2007/0085812 A1 * | 4/2007 | O. et al. .......................... | 345/100 |

FOREIGN PATENT DOCUMENTS

| JP | S62-183272 A | 8/1987 |
|---|---|---|
| JP | H10-268842 A | 10/1998 |
| JP | 2002-358051 A | 12/2002 |
| JP | 2003-140619 | 5/2003 |
| JP | 2003-140619 A | 5/2003 |
| JP | 2004-170768 A | 6/2004 |
| JP | 2005-208448 A | 8/2005 |

OTHER PUBLICATIONS

Japanese Office Action "Notification of Reason for Refusal" with mailing date of Aug. 30, 2011; Japanese Patent Application No. 2005-378254 with extract translation.

* cited by examiner

*Primary Examiner* — Sumati Lefkowitz
*Assistant Examiner* — Rodney Amadiz
(74) *Attorney, Agent, or Firm* — Studebaker & Brackett PC; Donald R. Studebaker

(57) ABSTRACT

A display device includes a scanning line drive circuit, which includes plural stages of D type of flip-flops (DFFs) connected in cascade. The first DFF stage receives a pixel signal of video data to be displayed. These DFF stages have outputs respectively connected to AND gates. The DFF stages and AND gates receive a common clock signal. The DFF stages are responsive to the clock signal to sequentially shift respective values held therein to the following stages with delay. Thus, a drive device is provided which can drive a display panel in a simple configuration without using an OE (Output Enable) signal.

7 Claims, 7 Drawing Sheets

2

DEVICE FOR DRIVING A DISPLAY PANEL WITH SEQUENTIALLY DELAYED DRIVE SIGNAL

BACKGROUND OF THE INVENTION

1. Field of the Invention

The present invention relates to a drive device for driving a display panel such as a liquid crystal display panel or an electroluminescence display panel.

2. Description of the Background Art

Recent well-known display devices for displaying video include a flat display device such as a liquid crystal display device or an electroluminescence display device. Such a flat type display device may include a liquid crystal display panel having sets of a switching device and a liquid crystal cell arranged in horizontal and vertical scanning directions, a scanning line drive circuit connected to the display panel for driving its scanning drive lines, and a signal line drive circuit connected to the display panel for applying pixel signals to its signal lines to drive the lines, the flat type display device being operable in a driving method of sequentially driving the signal lines on a scanning drive line basis, and sequentially writing each horizontal line of pixels during its horizontal scanning period.

The scanning line drive circuit sequentially applying the drive signals in the vertical scanning direction has been conventionally adapted to include, for example, as shown in FIG. 6 of Japanese patent laid-open publication No. 2003-140619, a shift register, a deselecting circuit, and a level shifter, wherein a shift clock CK is inputted to the shift register to sequentially shift a start signal ST, an output control signal EN is applied to the unselecting circuit to make the scanning signal outputted from the AND gate to its low level.

The conventional driving method has, however, a problem that in order to prevent the scanning signals inputted from the shift register to the AND gate from overlapping, the output control signal EN, i.e. an OE (Output Enable) signal, needs to be provided, thus requiring the OE signal to be generated and increasing the signal lines. This raises another problem that the driving method is totally expensive.

SUMMARY OF THE INVENTION

It is therefore an object of the present invention to provide a drive device that may drive a display panel such as a liquid crystal display panel, in a simpler configuration without using the OE (Output Enable) signal.

The present invention provides a drive device for driving a display panel, the drive device including a scanning line drive circuit for driving the display panel in a direction of an array of scanning drive lines, the scanning line drive circuit comprising: a shift register having a plurality of delay circuits connected in cascade for sequentially shifting input data in response to a first clock signal; a plurality of operational circuits connected respectively to outputs of the plurality of delay circuits for operating the outputs of said plurality of delay circuit with the first clock signal; and a plurality of level shifters connected respectively to operational outputs of the plurality of operational circuits for shifting a voltage level of the respective operational outputs to output respective shifted levels.

According to an aspect of the present invention, the scanning line drive circuit includes a shift register having a plurality of delay circuits connected in cascade for sequentially shifting input data in response to a first clock signal. In response to the first clock signal, the scanning line drive circuit selects the outputs of the shift register, thus removing the use of OE signal and the input line for the OE signal. The scanning line drive circuit may also be adapted to include a generator circuit that generates first and second clock signals separated from a third clock signal to allow delay circuits included in the shift register to operate in response to these first and second clock signals, thereby providing a good output signal, and allowing the shift register to be reset without extremely increasing the circuit scale.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 2:
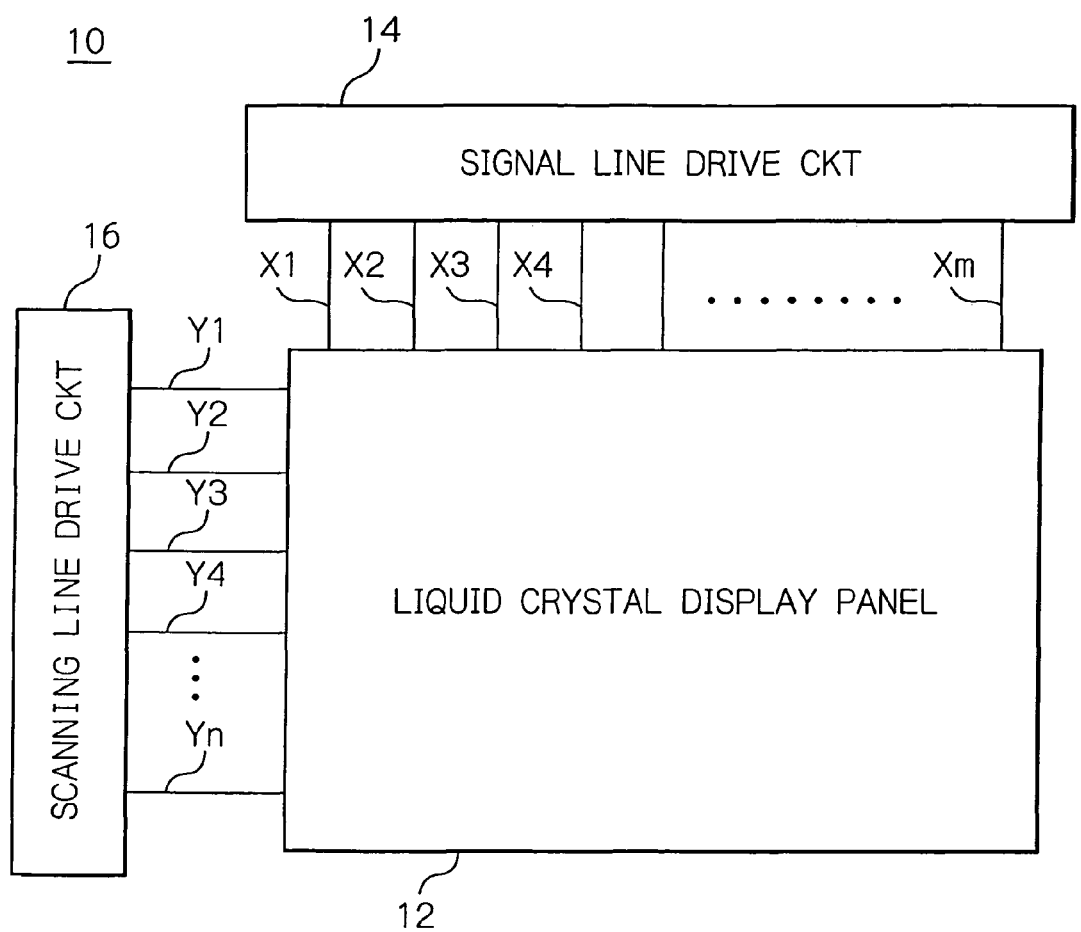
FIG. 2 is a schematic diagram of an embodiment of the display device to which the present invention is applied.

With reference to the accompanying drawings, preferred embodiments of a drive device of the present invention will be described in more detail. First, reference will be made to FIG. 2 which shows an embodiment of a display device to which applied is the drive device of the present invention. A display device 10 of this embodiment includes a liquid crystal display panel 12 having sets of a switching device and a liquid crystal cell arranged in horizontal and vertical scanning directions of a display screen, not shown, a signal line drive circuit 14 for applying pixel signals of video data to be displayed to signal lines to drive the signal lines, and a scanning line drive circuit 16 that generates drive signals for scanning scanning drive lines in the vertical scanning direction, thereby driving the signal lines on a scanning drive line basis, and sequentially writing a horizontal line of pixels in its horizontal scanning period. Elements or components not directly relevant to understanding the present invention will be omitted from the description and the figures.

The liquid crystal display panel 12 may be an active matrix display panel that has, on a substrate, a plurality of scanning drive lines formed in the horizontal scanning direction, and a plurality of signal lines formed in the vertical scanning direction substantially perpendicular to the scanning drive lines. The active matrix display panel further includes, at least one switching device and a pixel electrode connected thereto that are arranged in the vicinity of each intersection point of the scanning drive and signal lines.

The signal line drive circuit 14 is adapted to be responsive to pixel signals inputted from outside to produce pixel signals X1 to Xm to drive the respective signal lines of the liquid crystal display panel 12. The outputs X1 to Xm of the signal line drive circuit 14 connect to the liquid crystal display panel 12. Signals are designated with reference numerals specifying connections on which they are conveyed.

The scanning line drive circuit 16 is adapted to generate drive signals Y1 to Yn to sequentially scan the scanning drive lines of the liquid crystal display panel 12 in the vertical scanning direction. The outputs Y1 to Yn of the scanning line drive circuit 16 also connect to the liquid crystal display panel 12.

Figure 1:
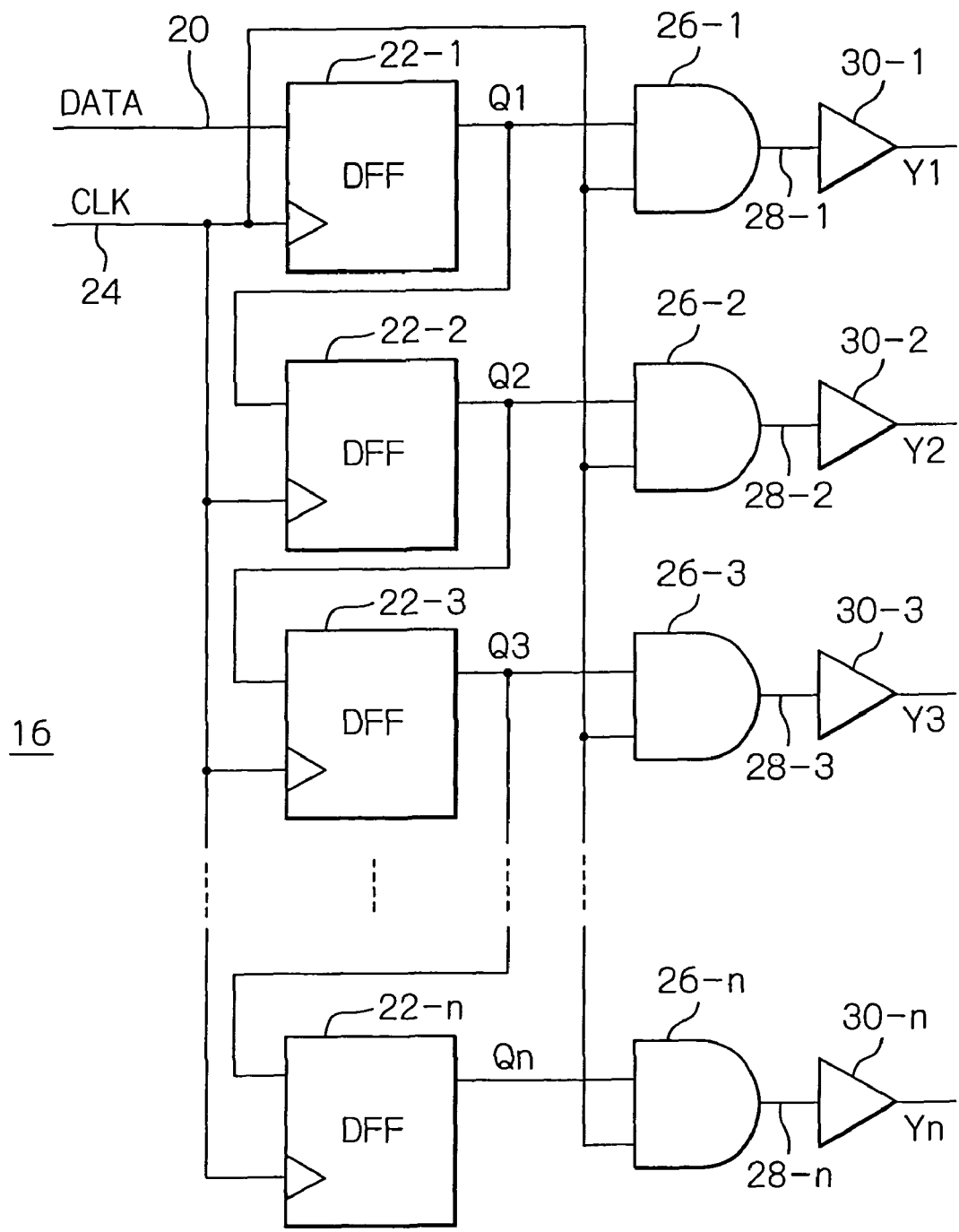
FIG. 1 schematically shows an illustrative embodiment of the scanning line drive circuit in accordance with the present invention.

FIG. 1 shows a configuration example of the scanning line drive circuit 16 of the instant embodiment. As shown, the scanning line drive circuit 16 includes a set of D (Delay) type of flip-flops (DFFs) connected in cascade. More specifically, the set of flip-flops comprises the first stage DFF 22-1 provided with a pixel signal (DATA) 20, the second stage DFF 22-2 connected to the output Q1 of the DFF 22-1, a DFF 22-3 connected to the output Q2 of the DFF 22-2, a further stage DFF, not-shown, connected to the output Q3 of the DFF 22-3, and a DFF 22-n connected to the final stage n (where n is a positive integer). These DFFs 22-1 to 22-n (hereinafter referred to generally as D type flip-flops or DFFs 22) are each provided with a common clock signal (CLK) 24. The D type flip-flops 22 forms a shift register in which, at the positive-going edge of the clock signal, the respective held values are sequentially shifted to the next stage of the D type flip-flops 22 with delay. The outputs Q1 to Qn of the D type flip-flops 22 are also connected to one input of the respective AND gates 26-1 to 26-n respectively associated therewith.

The AND gates 26-1 to 26-n each have another input provided with the clock signal 24. Each of the AND gates 26-1 to 26-n (hereinafter referred to generally as AND gates 26) produces a logical product of the outputs Q1 to Qn of the D type flip-flops 22 and the clock signal 24, and outputs the operation results to respective outputs 28-1 to 28-n. The outputs 28-1 to 28-n connect to respective level shifters 30-1 to 30-n. The level shifters 30-1 to 30-n are adapted for converting or shifting the respective outputs 28-1 to 28-n of the AND gates 26 to the voltage levels appropriate for driving the switching devices in the liquid crystal display panel 12 to drive the display panel 12.

The D type flip-flops 22 render, when the clock signal 24 is of its low level (L), each of the outputs Q1 to Qn to the low level thereof, and output, when the clock signal 24 is of its high level (H), on the respective outputs Q1 to Qn the held data of the D type flip-flops 22, or the shift register, in response to the input signal to the input 20. The D type flip-flops 22 are designed to make data transition in response to the positive-going edge of the clock signal 24.

Figure 3:
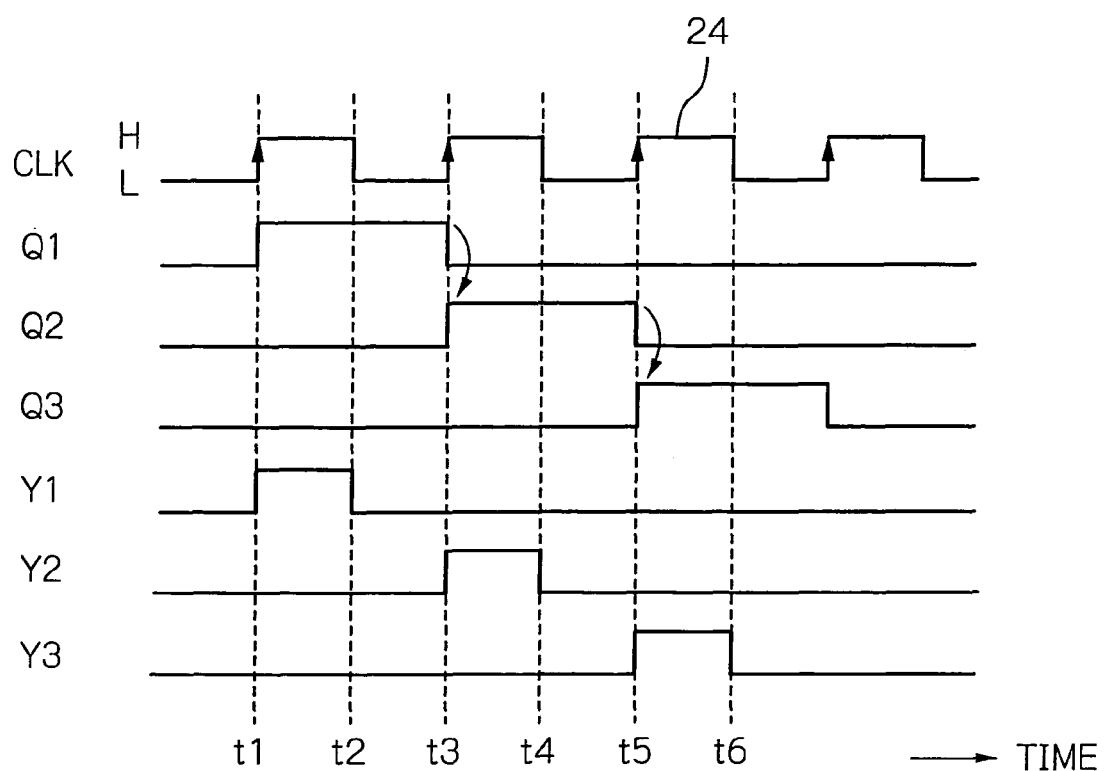
FIG. 3 is a timing chart useful for understanding the operation of the scanning line drive circuit shown in FIG. 1.

The operation of the D type flip-flops 22 will be described below with reference to the timing chart in FIG. 3. As shown, the output Q1 of the D type flip-flop 22-1 becomes its high level in response to the positive-going edge timing (time t1) of the clock signal 24, and becomes its low level in response to the next positive-going edge (time t3) of the clock signal. The next stage D type flip-flop 22-2 receives the output Q1 at the timing of that positive-going edge (time t3), and renders its output high in response to that transition. Likewise, the following stage D type flip-flop 22-3 receives the output Q2 at the timing (time t5), and renders its output high in response to that transition.

These outputs Q1 to Q3 are logically multiplied in the respective AND gates 26 by the clock signal CLK into an output Y1 from time t1 to t2, an output Y2 from time t3 to t4, and an output Y3 from time t5 to t6, respectively, which are then output from the respective level shifters 30 in the form of drive signals Y1 to Y3, respectively. Likewise, the further subsequent stages of the D type flip-flops 22 also provide drive signals Yi, which are in turn provided to the liquid crystal display panel 12, the suffix i being 4 through n.

As described above, the instant embodiment is adapted to provide each of the AND gates 26 with the clock signal supplied to the D type flip-flops 22, thereby providing the same function as when the OE (Output Enable) signal would be used, without using the OE signal. This embodiment is also adapted to allow the outputs of the shift register, or D type flip-flops, 22 to be selected by the AND gates 26, thereby providing fewer signal lines and allowing the scanning line drive circuit 16 to be made in the form of integrated circuit fabricated on a smaller semiconductor chip.

Figure 4:
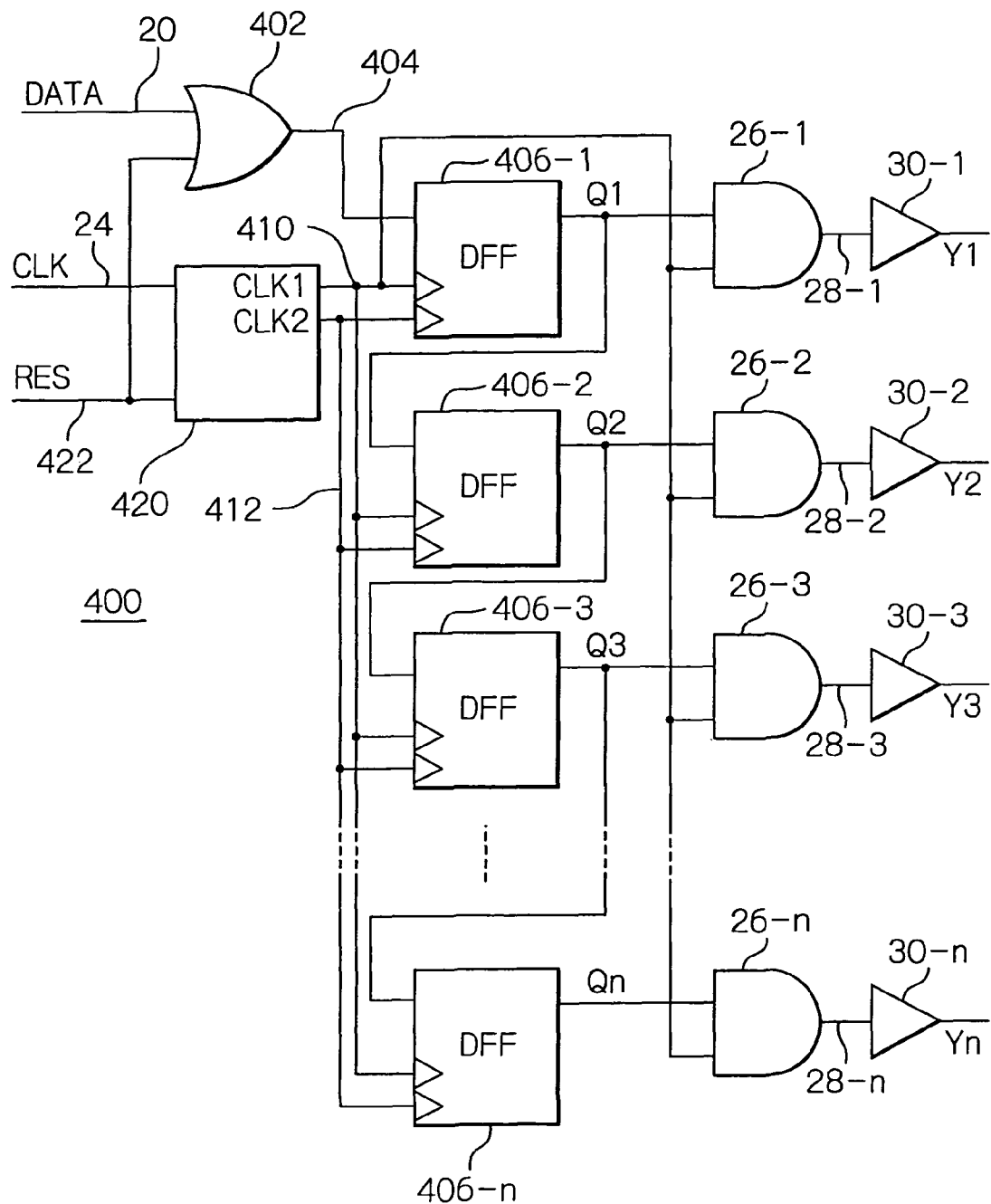
FIG. 4 is an alternative embodiment of the scanning line drive circuit in accordance with the invention.

Referring now to FIG. 4, an alternative embodiment of the display device will be described below. The display device of this alternative embodiment may have the same entire configuration as the display device 10 of the illustrative embodiment shown in and described with reference to FIG. 2 except that the alternative embodiment includes a scanning line drive circuit 400 shown in FIG. 4 rather than the scanning line drive circuit 16 shown in FIG. 2.

As shown, the scanning line drive circuit 400 of this alternative embodiment includes, as in the configuration shown in FIG. 1, the AND gates 26-1 to 26-n, and the level shifters 30-1 to 30-n connected to the outputs 28-1 to 28-n of the AND gates 26-1 to 26-n, respectively. The scanning line drive circuit 400 further includes a first stage DFF 406-1 that receives on its input 404 the pixel signal (DATA) 20 via an OR gate 402, the second stage DFF 406-2 connected to the output Q1 of the DFF 406-1, a DFF 406-3 connected to the output Q2 of the DFF 406-2, a further DFF, not-shown, connected to the output Q3 of the DFF 406-3, and a DFF 406-n connected to the final stage n. Each of the DFFs 406-1 to 406-n, which are connected in cascade and hereinafter also referred to generally as D type flip-flops 406, is interconnected to receive two types of clock signals (CLK1 and CLK2) 410 and 412. The D type flip-flops 406 form a shift register that is adapted to be responsive to these clock signals, shift the respective held values to the respective next stage of the D type flip-flops 406.

The outputs Q1 to Qn of the D type flip-flops 406 connect to the respective AND gates 26-1 to 26-n at one input thereof. The AND gates 26-1 to 26-n each have another input which is provided with a common clock signal (CLK1) 410.

Figure 5:
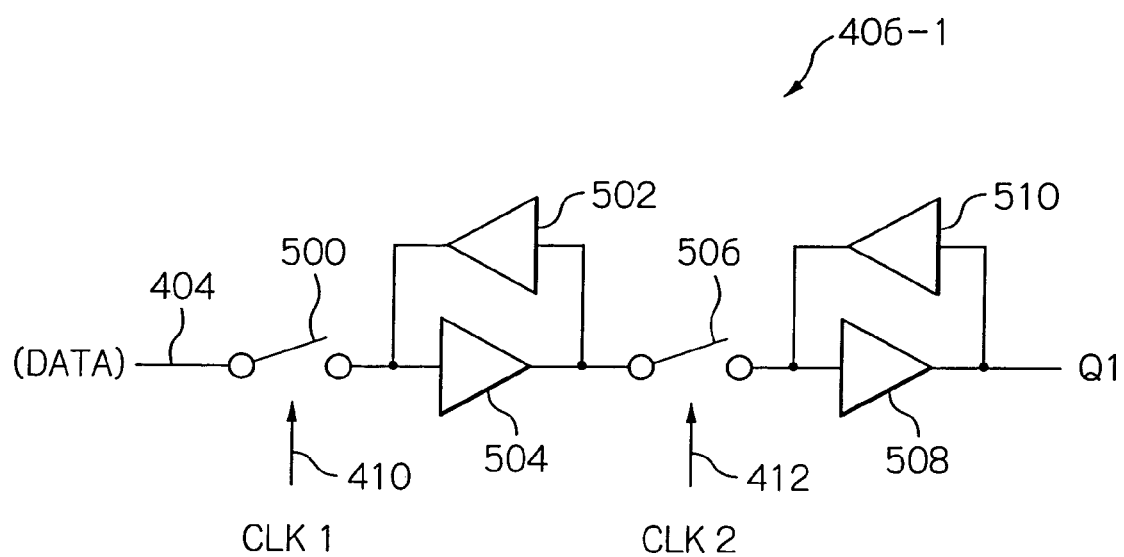
FIG. 5 shows an illustrative constitution of the D type of flip-flop.

FIG. 5 shows a configuration example of the D type flip-flop 406-1. Although FIG. 5 shows the D type flip-flop 406-1 by way of example, the remaining D type flip-flops 406-2 to 406-n may have the same configuration as the D type flip-flop 406-1. The D type flip-flop 406-1 has its input 404 connected via a switch 500 to a pair of buffers 502 and 504 that are connected in parallel to each other with an input of one buffer 502 connected to an output of the other buffer 504. These buffers 502 and 504 in turn are serially connected via a switch 506 to a pair of buffers 508 and 510 that are connected also in parallel to each other with an input of one buffer 508 connected to an output of the other buffer 510. The pair of buffers 508 and 510 has its other end forming the output Q1 of the flip-flop 406-1.

The one switch 500 is operatively connected to receive the one clock signal (CLK1) 410. The other switch 506 is operatively connected to receive the other clock signal (CLK2) 412. The switches 500 and 506 are provided to be turned on and off in response to the clock signals 410 and 412, respectively, thus D type flip-flops 406 functioning as a shift register for holding the input data 404 and outputting them with delay A.

Returning to FIG. 4, these clock signals (CLK1 and CLK2) 410 and 412 are generated by a generator circuit 420 that receives the original or reference clock signal CLK on its one input 24 and a reset signal RES at its other input 422, thus generating the clock signals (CLK1 and CLK2) 410 and 412. The one clock signal (CLK1) 410 is generated by modifying the duty ratio of the clock signal 24, the duty ratio being represented by to a ratio of the high level duration to one period of a rectangular wave. The other clock signal (CLK2) 412 is resultant from shifting a clock that by 180 degrees in phase with respect to the one clock signal (CLK1) 410, i.e. the inverse-phase clock.

Figure 6:
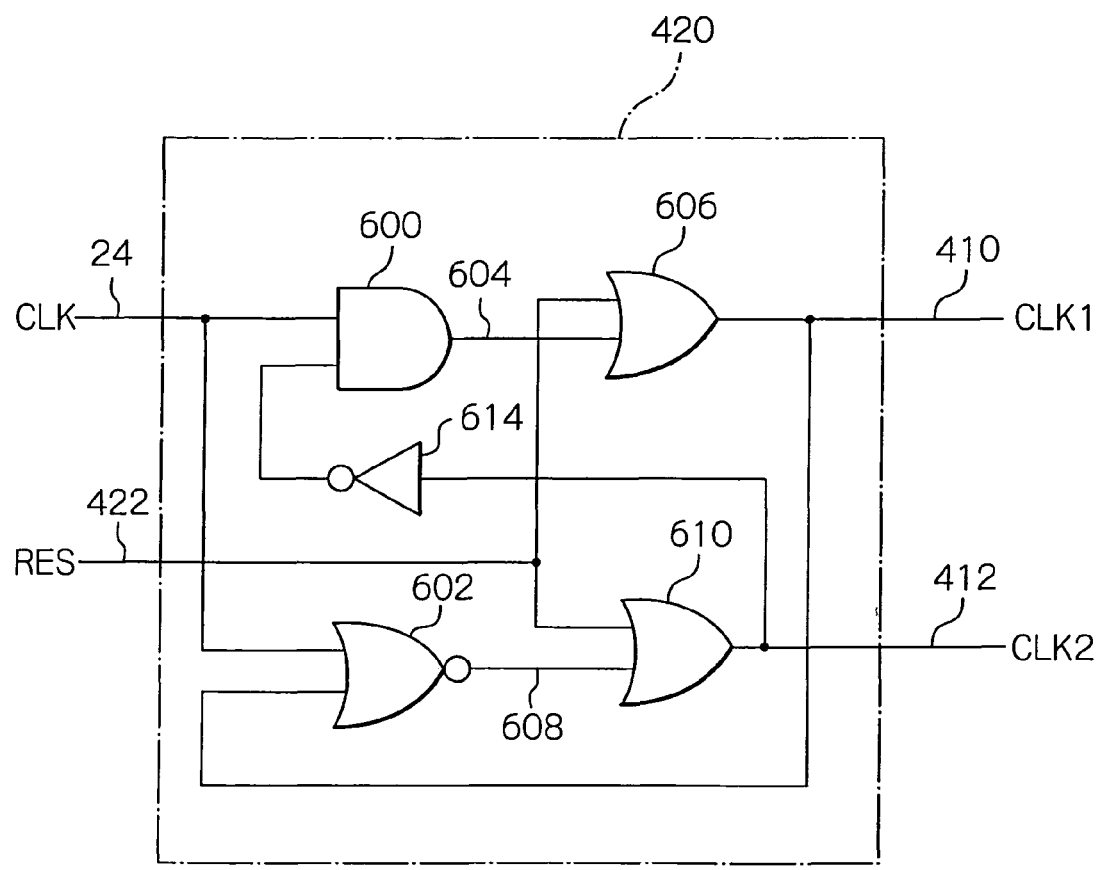
FIG. 6 shows an illustrative constitution of the generator circuit.

FIG. 6 shows a configuration example of the generator circuit 420. As shown, the generator circuit 420 includes an AND gate 600 and a NOR gate 602 that are each connected to receive the clock signal 24 on their inputs, one OR gate 606 connected to the output 604 of the AND gate 600, and another OR gate 610 connected to the output 608 of the NOR gate 602. The OR gate 610 has its output 412 connected via a NOT circuit 614 to the other input of the AND gate 600 to form the output of the generator circuit 420 that outputs the clock signal (CLK2).

The OR gates 606 and 610 are each connected to receive on the other input thereof a reset signal (RES) 422, which takes its low level significant. The OR gate 606 has its output 410 that connects to the other input of the NOR gate 602 and forms the output of the generator circuit 420 that outputs the clock signal CLK1.

Figure 7:
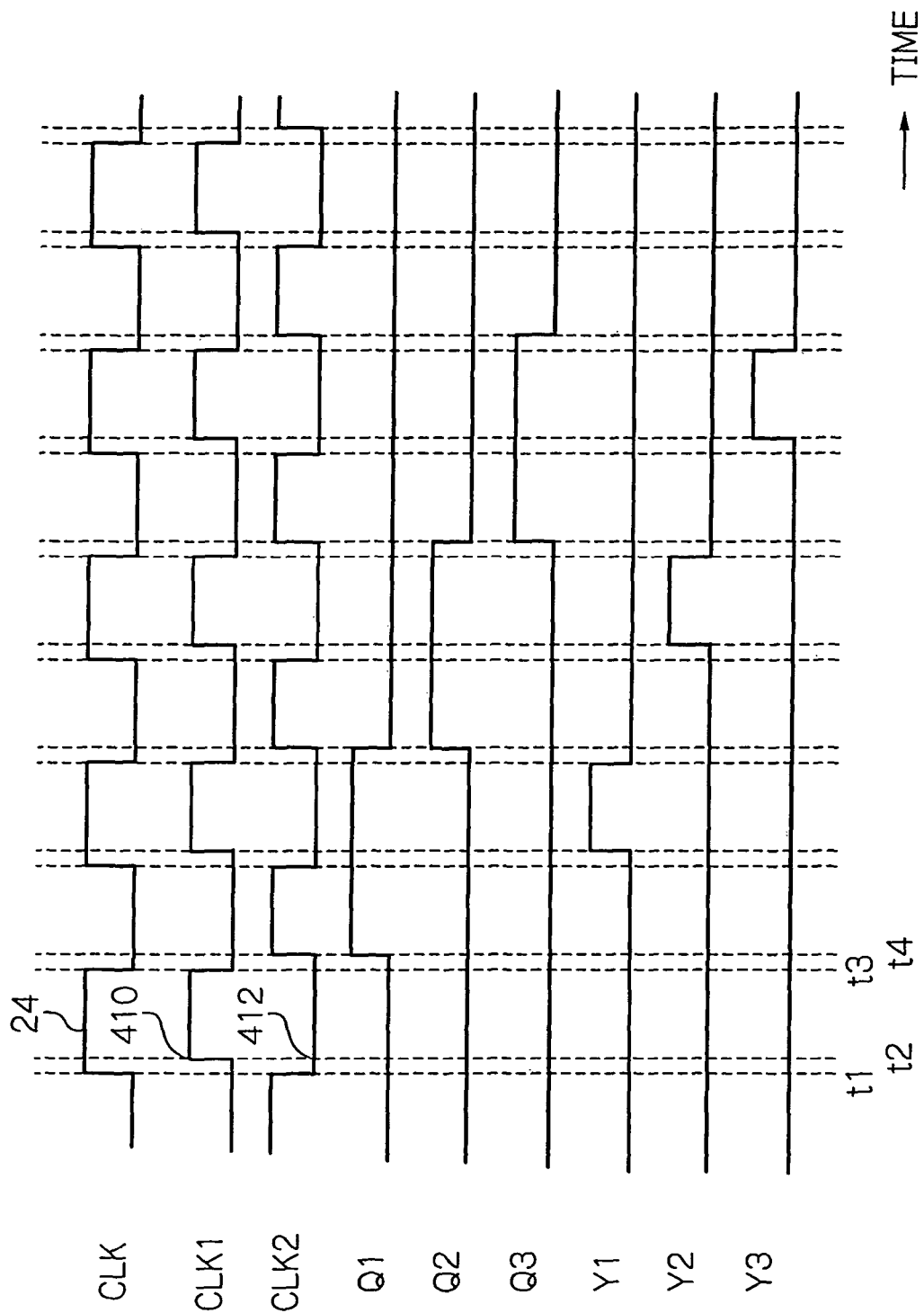
FIG. 7 is a timing chart useful for understanding the operation of the scanning line drive circuit.

FIG. 7 shows how these clock signals (CLK1 and CLK) 410 and 412, the outputs Q1 to Qn, and the outputs Y1 to Yn are developed. When, at time t1, the positive-going edge of the clock signal 24 is received by the AND gate 600 and NOR gate 602, the output 608 is rendered low to cause the output 412, i.e. clock signal CLK2, of the OR gate 610 to be shifted to its low level, which is then inverted by the NOT circuit or inverter 614, which outputs the inverted value to the AND gate 600.

At time t2, the AND gate 600 outputs the logical product of the input 24 and the output of the NOT circuit 614 on its output 604, thus shifting the clock signal (CLK1) 410 to its high level. Then, at time t3, the clock signal 24 rendered low causes the AND gate 600 to output 604 in its low level, which in turn causes the OR gate 606 to output its low level as the low level of the clock signal (CLK1) 410.

At time t4, the low-level clock signal 24 and the clock signal (CLK1) 410 that has already been low are inputted to the NOR gate 602, thus shifting the output 608 to its high level at time t4. The output 608 then causes the OR gate 610 to produce the clock signal (CLK2) 412 in its high level, which is then outputted from the output 412.

The clock signals 410 and 412 thus generated are inputted to the D type flip-flops 406. In the D type flip-flops 406, the switches 500, FIG. 5, are turned on in response to the clock signal 410 to hold the input data, and turns on the switches 506 in response to the clock signal 412 to output the held data. Specifically, the one clock signal 410 thus is rendered high and then low, followed by the other clock signal 412 becoming high, thereby causing data to be transferred. Such an operation done by each of the D type flip-flops 406 provides, as shown in FIG. 7, the outputs Y1 to Y3 from the level shifters 30-1 to 30-3, respectively, to accordingly drive the liquid crystal display panel 12. Likewise, the output Yi of the level shifter 30-i is supplied to the liquid crystal display panel 12, i being 4 through n.

As described above, the alternative embodiment is adapted to generate two sorts of clock signal separated from the original or basic clock with transitions to high and low levels involved which are opposite in phase with a time difference therebetween and being used to sequentially shift the input data with delay. The alternative embodiment thereby takes the advantage, in addition to those provided by the embodiment shown in FIG. 1, of preventing a sag, like an impulse, from being included in the output waveform of the shift register, thereby allowing good drive signals perfectly free from overlapping with each other to be generated without using the signal line for conveying the OE signal input.

Although, in that case, although the scanning line drive circuit 400 requires an additional signal line, the generator circuit 420 for generating the two clock signals may be provided in single in the scanning line drive circuit 400, which will not largely affect the chip area fabricating the device.

Note that in the configuration of the generator circuit 420 shown in FIG. 6, a significant reset signal RES, when given to the input 422, is directly inputted to the OR gates 606 and 610 to make their outputs 410 and 412 high at the same time, thereby performing bulk resetting operation in which these high-level clock signals 410 and 412 causes the switches 500 and 506 in the D type flip-flops 406 to be turned on at the same time. The bulk resetting operation causes the shift register, when reset, to be rendered conductive, thereby accomplishing the reset function without supplying each of the D type flip-flops 406 with a reset signal or increasing the number of circuit components in the device.

Note that although the illustrative embodiments described above are directed to the scanning line drive circuit 16 adapted for scanning the liquid crystal display panel 12, the invention is not limited thereto, but applicable to the electroluminescence (EL) display panel, for example. The scanning line drive circuit 16 may be provided for each of blocks of liquid crystal display devices of a liquid crystal panel in such a fashion that each drive circuit 16 is connected to one of the blocks, thereby driving the liquid crystal panel on a block-by-block basis.

The entire disclosure of Japanese patent application No. 2005-378254 filed on Dec. 28, 2005, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A drive device for driving a display panel, said drive device including a scanning line drive circuit for driving said display panel in a direction of an array of scanning drive lines, said scanning line drive circuit comprising:
   a shift register having a plurality of delay circuits connected in cascade for delaying input data and sequentially shifting the input data in response to a positive-going edge of a first clock signal;
   a plurality of operational circuits connected respectively to outputs of said plurality of delay circuits for operating the outputs of said plurality of delay circuits with the first clock signal;
   a plurality of level shifters connected respectively to operational outputs of said plurality of operational circuits for shifting a voltage level of the respective operational outputs to output respective shifted levels; and
   a generator circuit for generating the first clock signal and a second clock signal in accordance with a third clock signal, said shift register being operative in response to the first and second clock signals to shift the input data, wherein said delay circuit holds the input data in response to the first clock signal, and outputs the input data in response to the second clock signal.

2. The drive device in accordance with claim 1, wherein said generator circuit modifies a duty ratio of the third clock signal to generate the first clock signal.

3. The drive device in accordance with claim 2, wherein said generator circuit inverts a phase of the first clock signal to generate the second clock signal.

4. The drive device in accordance with claim 1, wherein said generator circuit inverts a phase of the third clock signal at timings different from each other and opposite in phase to generate the first and second clock signals.

5. The drive device in accordance with claim 1, wherein said register performs a reset operation in response to a reset signal provided from outside.

6. The drive device in accordance with claim 1, further comprising a signal line drive circuit for supplying a pixel signal to said display panel to drive said display panel.

7. The drive device in accordance with claim 1, wherein said display panel is a liquid crystal display panel.

* * * * *